United States Patent [19]

Yu

[11] Patent Number: 5,651,040
[45] Date of Patent: Jul. 22, 1997

[54] DYNAMIC DIVISION SYSTEM AND METHOD FOR IMPROVING TESTABILITY OF A COUNTER

[75] Inventor: Tein-Yow Yu, Chandler, Ariz.

[73] Assignee: VLSI Technology, Inc., San Jose, Calif.

[21] Appl. No.: 646,043

[22] Filed: May 7, 1996

[51] Int. Cl.⁶ .................................................. H03K 21/40
[52] U.S. Cl. .................................................. 377/29
[58] Field of Search .................................................. 377/29

[56] References Cited

U.S. PATENT DOCUMENTS

| 4,661,930 | 4/1987 | Tran ........................... 377/29 |
| 5,402,458 | 3/1995 | Moughanni .................. 377/29 |

FOREIGN PATENT DOCUMENTS

| 0092673 | 4/1989 | Japan ........................... 377/29 |

Primary Examiner—Margaret Rose Wambach
Attorney, Agent, or Firm—LaValle D. Ptak

[57] ABSTRACT

A method and system for testing a digital counter of mn bits comprises dividing the counter into m segments, each of n bits. For test purposes, the counter then is further divided into first and second m segment groups. Multiplex gates are used between the segments and are controlled by sensing the condition of the most significant bits of the most significant one of the m segments for applying clock pulses to verify specific connections between various bits of the counter for the first four cycles of clock pulses applied during the test mode. After these four cycles, gating circuits coupled with the most significant bits of the most significant one of the m segments are used to automatically switch the remainder of the test connections to the second group to verify all of the remaining connections in the counter, with full testing of the counter being accomplished in $2^n+2$ cycles of clock pulses.

11 Claims, 1 Drawing Sheet

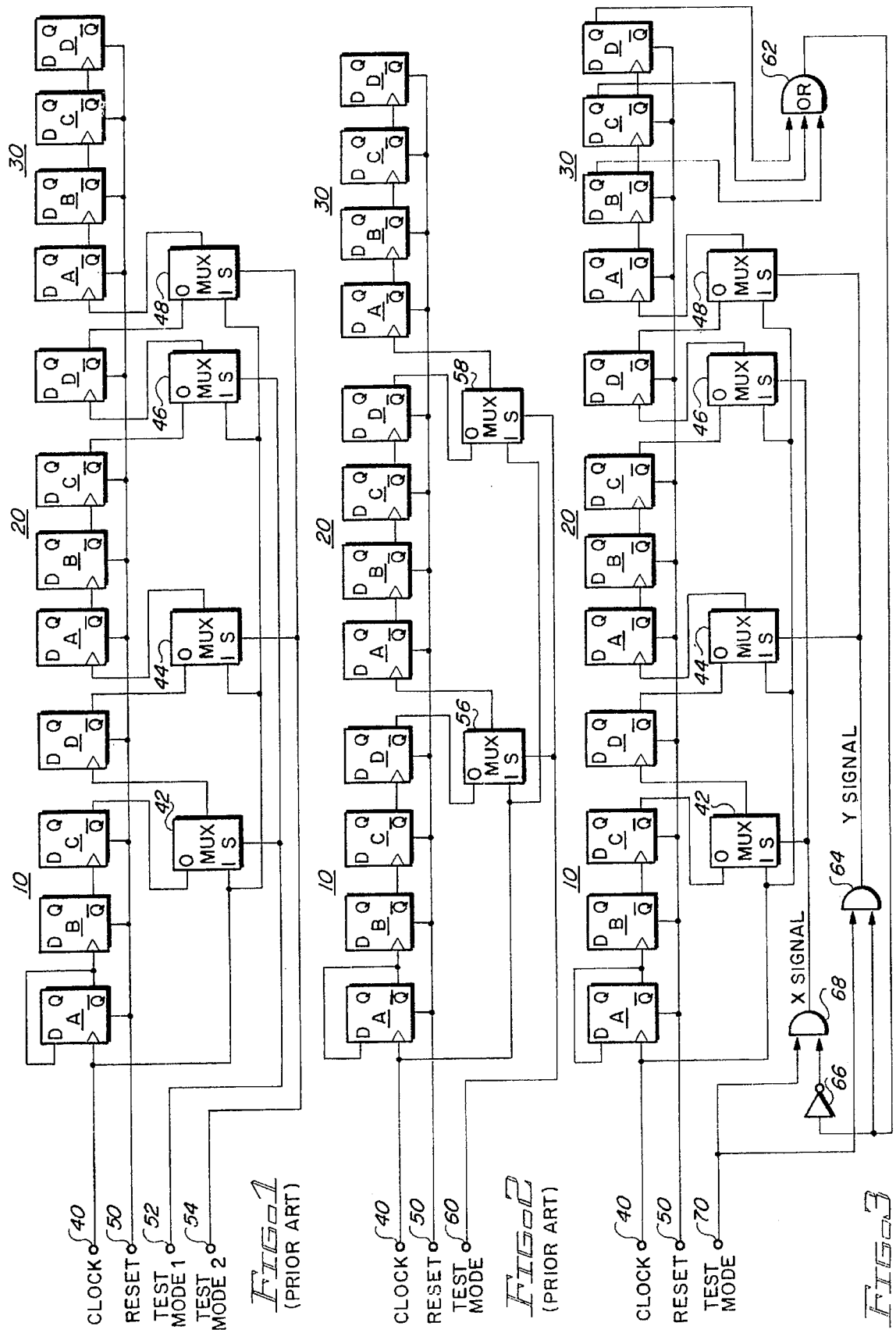

DYNAMIC DIVISION SYSTEM AND METHOD FOR IMPROVING TESTABILITY OF A COUNTER

BACKGROUND

Digital counters having a large component count currently are used in integrated circuit and other circuit applications. Such counters may be referred to as high bit-count counters. Typically, they are used for timeout counters or timers in a variety of different applications. Some such applications include the timing of various functions in real time computer operation.

In order to test the accuracy of high bit-count digital counters, the counters should be operated through the entire range of counts capable of implementation by such counters. To test a counter having a large number of stages in real time, however, consumes an extremely large amount of tester time. This is particularly true if the counter must be operated in a normal mode, since the counter clock for a normal mode of operation generally is at a lower frequency than higher frequencies which are available in some test modes of operation.

Efforts have been made to shorten the time required for testing large multi-stage counters by segmenting the counter stages into different groups and then testing the groups in parallel with one another. Parallel testing of the counters within each group then significantly reduces the testing time, but fails to test the interface or connections between the different groups within the counter. Thus, it is possible for errors to exist in the interfaces, which are not tested by such a system. Failure to detect such errors may result in the incorporation of a flawed counter into a finished product. This type of testing is called a fixed division scheme, which cannot fully test a counter because, with the exception of the least significant bit of the counter, the least significant bits of each divided section of the counter cannot be tested.

To fully test large bit-count multi-stage counters, systems have been designed to employ two fixed division schemes to ensure testing of the interface or connections between the segments. In such a system, two test modes are employed. The first test mode is used for testing the portion of the interface connections between the segments. After this first portion of the test has been run, a switchover to the second test mode is made to complete the testing of the remainder of the counter and interfaces. While this type of system permits parallel testing of the stages of the counters in different groups of equal numbers of stages, time is wasted in the tester during the switching over from one test mode to the other test mode.

A system which has been designed to accelerate counter testing without the loss of fault coverage is disclosed in the Moughanni U.S. Pat. No. 5,402,458. The system of this counter divides the counter into a number of different segments, each having an equal number of bits or stages. The system operates to detect when each segment nears the last count and overrides the test mode to re-enable a between segment clock path between the segments before the last count to permit the last count to ripple through the counter to test connections between segments on the next clock cycle. While this system theoretically functions to test all of the stages, as well as the interface connections between the different segments of the counter, a test of these connections from one segment to the next is only effective from a cycle of "0" to "1". The system cannot test between segments where the count changes from "1" to "0" in the interface. As a consequence, while the Moughanni system overcomes many of the disadvantages of the prior art, an incomplete test results from this inherent weakness in the interconnections between the different segments of the counter undergoing a test with the system of Moughanni. The Moughanni system does operate to produce a rapid test of the counter with a relatively low number of clock cycles $(S-2)+2^b$ clock cycles where S is the number of segments and b is the number of bits or stages per segment.

It is desirable to provide a system and method for testing digital counters which eliminates switchover time between the testing of different blocks and which fully tests all of the toggle nodes of the counter for a complete, rapid, efficient test.

SUMMARY OF THE INVENTION

In accordance with a preferred embodiment of the invention, a counter of mn bits undergoing tests is divided into m segments of n bits each.

The m segments then are divided into two groups; the first group comprising 1 to n−1, n to 2n−1, 2n to 3n−1, . . . , (m−2)n to (m−1)n−1, (m−1)n to mn; and the second group comprising 1 to n, n+1 to 2n, 2n+1 to 3n, . . . , (m−2)n+1 to (m−1)n, (m−1)n+1 to mn. Multiplex gates responsive to a test mode signal select the first group for four clock cycles. At the completion of this sequence, which is detected by gates coupled with the most significant bits of the most significant or last one of the m segments, the system switches select the second group to finish the test cycle. The counter is fully tested by $2^n+2$ cycles of clock pulses.

BRIEF DESCRIPTION OF THE DRAWING

FIG. 1 is a block diagram of a prior art digital counter test circuit;

FIG. 2 is a block diagram of another prior art test circuit for a digital counter; and FIG. 3 is a block diagram of a preferred embodiment of the invention.

DETAILED DESCRIPTION

Reference now should made to the drawing, in which the same reference numbers are used throughout the different figures to designate the same components. In each of the three figures, a twelve stage or twelve bit digital ripple counter is illustrated, in which the stages or bits are divided into three segments of four bits each. The segments are shown as segments 10, 20 and 30 in all three figures of the drawing. The interconnections between the different stages of the counter are standard; and clock pulses applied to an input terminal 40 drive the counter. Prior to testing any of the counters shown in FIGS. 1, 2 or 3, a reset pulse is applied to a terminal 50. This pulse, coupled to the reset input of each of the stages of the counter segments 10, 20 and 30 causes all of the stages (bits) of the counters to be set to "zero". This reset pulse is applied prior to operation of any of the counters of FIGS. 1, 2 and 3 in the test mode.

Reference first should be made to the prior art fixed division scheme counter shown in FIG. 2. This is a standard test mode which is widely used to significantly reduce the testing time of a counter. When the counter is operated in the test mode, a signal is applied over the terminal 60 to enable a pair of multiplex gates 56 and 58 to pass signals therethrough, which are applied either the "zero" or "one" inputs thereof. As illustrated in FIG. 2, the clock pulses which are applied to the first stage of the segment 10 also are applied through the "one" inputs of the multiplex circuits 56 and 58 to the first or least significant bit stages of the segments 20 and 30. As a result, the three different segments 10, 20 and 30 of the counter are stepped or switched in parallel with one another; so that the test cycle is considerably reduced from that which would be required by simply stepping the counter completely through in its normal state of operation by applying clock pulses only to the least significant bit of the segment 10. It should be noted, however, that except for the least significant bit of the segment 10 of the counter, the least significant bits of each of the divided sections 20 and 30 cannot accurately be fully tested.

The prior art counter of FIG. 1 is designed to overcome the disadvantage noted above for the circuit of FIG. 2. In the circuit of FIG. 1, the counter again is divided into three different segments, each having four bits or stages 10, 20 and 30. Multiplex circuits 44 and 48, which are comparable to the circuits 56 and 58, are included in the same positions as the circuits 56 and 58 shown in FIG. 2. In addition, multiplex circuits 42 and 46 are inserted between the third and fourth stages or bits of each of the segments 10 and 20. The multiplex circuits 42 and 46 are operated in parallel in a first test mode identified in FIG. 1 as "test mode 1", with the test mode signals applied to the terminal 52. Similarly, the multiplex gates 44 and 48 are coupled with a terminal 54, which has applied to it test mode signals for "test mode 2". The signals applied to the terminals 52 and 54 are mutually exclusive, and alternate with one another. In the initial operation, the counter is operated in "test mode one" with an enabling signal applied to open or enable the multiplex gates 42 and 46. At this time, the gates 44 and 48 are closed or disabled. Clock pulses on the terminal 40 then cause the counter exercise to commence in parallel for each of the three segments 10, 20 and 30. At appropriate times, the signals on the test mode terminals 52 and 54 are changed. "Test mode 1" is terminated and "test mode 2" is enabled; so that a full test of the counter takes place. The switching between the two test modes, however, wastes time during the test cycle while the switching of the test modes takes place. As a consequence, the use of the two fixed division schemes of the counter of FIG. 1, while it is not subject to the incomplete testing of the circuit of FIG. 2, requires additional time for operation between the switching of the test modes.

To provide the advantages of a full and complete testing of all of the bits or stages of a high bit-count multi-stage counter, the circuit of FIG. 3 has been designed as an improvement over the prior art circuit shown in FIG. 1. As shown in FIG. 3, the portion of the counter with the multiplex gates 42, 44, 46 and 48 is identical to that shown in FIG. 1. Instead of using two test mode inputs, however, only a single test mode signal is applied to an input terminal 70.

The n−1 most significant bits (three of FIG. 3) of the last or highest segment 30 of the counter then are fed through an OR gate 62 directly to one input of an AND gate 64 and are inverted through an invertor 66 and applied to one input of an AND gate 68. The test mode enabling signal on the terminal 70 is applied to the other input of both of the AND gates 64 and 68. As shown in FIG. 3, the output of the AND gate 68 is designated as the "X" signal, whereas the output of the AND gate 64 is designated as the "Y" signal. The output of the gate 68 is used to enable the multiplex gates 42 and 46, whereas the output of the gate 64 is used to enable the gates 44 and 48.

In the circuit of FIG. 3, the clock pulses on the terminal 40 are applied to the "one" inputs of all of the multiplex gates 42, 44, 46 and 48, as well as to the clock input of the first or least significant bit stage of the segment 10 of the counter undergoing test. The output of the multiplex gate 42 then is supplied to the clock input of the most significant bit of the segment 10, whereas the output of the multiplex gate 44 is applied to the clock input of the least significant bit of the segment 20. Similarly, the output of the multiplex gate 46 is applied to the clock input of the most significant bit of the segment 20, whereas the output of the multiplex gate 48 is applied to the clock input of the least significant bit of the segment 30.

It is apparent that once the reset pulse 50 has been applied to all of the stages or bits of the counter segments 10, 20 and 30, all of the segments will be set to "0". This is the state of the counter at the initiation of the test cycle of operation. At this time it also should be noted that none of the inputs to the OR gate 62 are "1"; so that the output of the OR gate 62 is "0" at this time. This output is inverted by the inverter 66 to enable the AND gate 68. Thus, whenever the test mode signal first goes "high" on the terminal 70, the enabled AND gate 68 passes this signal to enable the multiplex gates 42 and 46 to pass clock pulses therethrough. This is the initial state of operation, which inserts a test mode signal X at n, 2n, . . . , (m−1)n bits where n is the number of bits in each of the segments 10, 20 and 30 and m is the number of segments. This insertion forces each of these segments 10, 20 and 30 to run independently.

The test mode signal X for the configuration shown in FIG. 3 is active for the first four clock cycles or the first four clock pulses. At this time, the output from the OR gate 62 changes from a "0" to a "1". This causes the enabling signal on the gate 68 to be removed and the gate 64 is enabled. This in turn enables the multiplex gates 44 and 48 for operation. The test signal "Y" from the output of the gate 64 then is active for the remainder of the test operation for a total test time of $2^n-2$ cycles.

The logic which is used to switch the test mode signal X from the AND gate 68 to the test mode signal Y from the AND gate 64 is derived from the bits (m−1)n+2 to the mn bit of the test counter. These bits are located in the segment 30 of FIG. 3. Thus, it can be seen from an examination of FIG. 3 that the test mode signal X is active when every bit from (m−1)n+2 to mn bit has a value of "0". Otherwise, if any bit from (m−1)n+2 to mn bit has a value of "1", the test mode signal "Y" is active as long as the counter test mode also is active, as determined by the signal on the input terminal 70.

The foregoing operation also may be explained by considering the mn bit counter, consisting of the segments 10, 20 and 30 to be divided into two m segment groups. The first of these groups is Group A: 1 to (n−1), n to (2n−1), 2n (3n−1), . . . (m−2)n2(m−1)n−1, (m−1)n to mn. As can be seen, the test mode signal X at the output of the gate 68 is inserted at n, 2n . . . (m−1)n bits to cause the m counter segments 10, 20 and 30 to run independently.

The second group, Group B, consists of: 1 to n, (n+1) to 2n (2n+1) to 3n, . . . (m−2)n+1 to (m−1)n, (m−1)n+1 to mn. In this mode, the test mode signal Y is inserted at n+1, 2n+1, . . . (m−1)n+1 bits to force every divided section of the mn bit counter to run independently.

Thus, it can be seen that the first four cycles, while the test mode X is active, forces the test counter to the Group A division. Then, the rest of the cycles while the test mode Y is active forces the test counter to the Group B division. The Y test mode cycles toggle all of the bits in the test counter except connections among n−1 to n, 2n−1 to 2n, . . . and (m−1)n−1 to (m−1)n. As a consequence, through a combination of the X and Y test mode cycles, the counter comprising the three segments 10, 20 and 30 has been fully tested by $2^n+2$ cycles. For the twelve-bit counter illustrated in FIG. 3, this means that a complete test of the counter is effected in eighteen cycles or clock pulses applied to the clock input terminal 40.

This operation for the circuit illustrated in FIG. 3 is indicated in the following table (next page), which shows the complete state of all of the stages of the counter for both the X and Y test modes:

TABLE 1

| 11 | 10 | 9 | 8 | 7 | 6 | 5 | 4 | 3 | 2 | 1 | 0 | Bit |
|---|---|---|---|---|---|---|---|---|---|---|---|---|
| 0 | 0 | 0 | 0 | 0 | 0 | 0 | 0 | 0 | 0 | 0 | 0 | Division X |
| 0 | 0 | 0 | 0 | 1 | 0 | 0 | 0 | 1 | 0 | 0 | 1 | Division X |
| 0 | 0 | 0 | 1 | 0 | 0 | 0 | 1 | 0 | 0 | 1 | 0 | Division X |
| 0 | 0 | 0 | 1 | 1 | 0 | 0 | 1 | 1 | 0 | 1 | 1 | Division X |
| 0 | 0 | 1 | 0 | 0 | 0 | 1 | 0 | 0 | 1 | 0 | 0 | Division X |
| 0 | 0 | 1 | 1 | 0 | 0 | 1 | 1 | 0 | 1 | 0 | 1 | Division Y |
| 0 | 1 | 0 | 0 | 0 | 1 | 0 | 0 | 0 | 1 | 1 | 0 | Division Y |
| 0 | 1 | 0 | 1 | 0 | 1 | 0 | 1 | 0 | 1 | 1 | 1 | Division Y |
| 0 | 1 | 1 | 0 | 0 | 1 | 1 | 0 | 1 | 0 | 0 | 0 | Division Y |
| 0 | 1 | 1 | 1 | 0 | 1 | 1 | 1 | 1 | 0 | 0 | 1 | Division Y |
| 1 | 0 | 0 | 0 | 1 | 0 | 0 | 0 | 1 | 0 | 1 | 0 | Division Y |
| 1 | 0 | 0 | 1 | 1 | 0 | 0 | 1 | 1 | 0 | 1 | 1 | Division Y |
| 1 | 0 | 1 | 0 | 1 | 0 | 1 | 0 | 1 | 1 | 0 | 0 | Division Y |
| 1 | 0 | 1 | 1 | 1 | 0 | 1 | 1 | 1 | 1 | 0 | 1 | Division Y |
| 1 | 1 | 0 | 0 | 1 | 1 | 0 | 0 | 1 | 1 | 1 | 0 | Division Y |
| 1 | 1 | 0 | 1 | 1 | 1 | 0 | 1 | 1 | 1 | 1 | 1 | Division Y |
| 1 | 1 | 1 | 0 | 1 | 1 | 1 | 0 | 0 | 0 | 0 | 0 | Division Y |
| 1 | 1 | 1 | 1 | 1 | 1 | 1 | 0 | 0 | 0 | 0 | 1 | Division Y |
| 0 | 0 | 0 | 0 | 0 | 0 | 0 | 0 | 0 | 0 | 1 | 0 | Division Y |

The foregoing description of a preferred embodiment of the invention has been made in conjunction with a "ripple" counter; but the system works as well with other types of counters. It also should be noted that the system has been illustrated where the segments of the counter each have the same number of bits in each segment. It should be understood, however, that the invention is not limited to a configuration where the segments are of equal size; but the segments may be varied in size within the scope of the invention. Irregular division, however, complicates the calculation of the clock cycle savings; although the overall operation which has been described is the same, whether the segments each contain the same number of bits or not.

Various changes and modifications may be made to the system and method which has been described in conjunction with the preferred embodiment for performing substantially the same function, in substantially the same way, to achieve substantially the same result without departing from the true scope of the invention as defined in the appended claims.

What is claimed is:

1. A method for testing a counter of mn bits by dividing the counter into m segments, each Of n bits, including the steps of:

organizing said counter into first and second m segment groups, the first group comprising: 1 to n−1, n to 2n−1, 2n to 3n−1, . . . , (m−2)n to (m−1)n−1, and (m−1)n to mn; and the second group comprising 1 to n, n+1 to 2n, 2n+1 to 3n, . . . , (m−2)n+1 to (m−1)n, (m−1)n+1 to mn;

providing a source of clock pulses for operating said counter;

inserting a test mode signal to automatically select said first group for the first four cycles of clock pulses; and automatically switching the testing of said counter to said second group for the remainder of $2^n-2$ cycles.

2. The method according to claim 1 wherein said selection of said first group for the first four cycles of clock pulses operates to test the connections between m segments of said second group.

3. The method according to claim 2 wherein the step of automatically selecting said second group forces said counter to test the remainder of the bits of said counter.

4. A system for testing a counter of mn bits in which the counter is organized into m segments, each of n bits, including in combination:

segmentation circuitry for operating the counter in a test mode which divides said counter into said first and second m segment groups, the first group comprising: 1 to n−1, n to 2n−1, 2n to 3n−1, . . . , (m−2)n to (m−1)n−1, (m−1)n to mn; and the second group comprising 1 to n, n+1 to 2n, 2n+1 to 3n, . . . , (m−2)n+1 to (m−1)n, (m−1)n+1 to mn;

a source of clock pulses;

a source of test mode signals applied to said segmentation circuitry for operating said counter in a test mode of operation;

a gate circuit coupled with the highest order bits of said highest order segment for controlling said segmentation circuitry to select said first group for the first four clock pulses, and automatically switching said segmentation circuitry to operate the counter as said second group for the remainder of a total of $2^n-2$ clock pulses.

5. The system according to claim 4 wherein said m segments of said counter are tested in parallel with one another.

6. The combination according to claim 5 wherein said segmentation circuitry comprises multiplex gates to divide said counter into said two groups of m segments when said counter is being operated in said test mode.

7. The combination according to claim 5 wherein said gate circuit comprises an OR gate coupled with the outputs of the n−1 most significant ones of said n bits of the most significant one of said m segments of said counter, with the output of said OR gate applied directly to a first AND gate to enable testing of said second group and being inverted and applied to a second AND gate, the output of which is used to enable said first group, with said test signal applied to a second input of each of said first and second AND gates.

8. The combination according to claim 7 further including multiplex gates coupled with the outputs of said first and second AND gates, respectively, for enabling selection of said second and first groups respectively.

9. The combination according to claim 4 wherein said segmentation circuitry comprises multiplex gates to divide said counter into said two groups of m segments when said counter is being operated in said test mode.

10. The combination according to claim 4 wherein said gate circuit comprises an OR gate coupled with the outputs of the n−1 most significant ones of said n bits of the most significant one of said m segments of said counter, with the output of said OR gate applied directly to a first AND gate to enable testing of said second group and being inverted and applied to a second AND gate, the output of which is used to enable said first group, with said test signal applied to a second input of each of said first and second AND gates.

11. The combination according to claim 10 further including multiplex gates coupled with the outputs of said first and second AND gates, respectively, for enabling selection of said second and first groups respectively.

* * * * *